(12) United States Patent
Chang et al.

(10) Patent No.: US 9,985,031 B2
(45) Date of Patent: May 29, 2018

(54) INTEGRATED CIRCUIT AND MANUFACTURING METHOD THEREOF

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 0 days. days.

(21) Appl. No.: 15/074,985

(22) Filed: Mar. 18, 2016

(65) Prior Publication Data

US 2017/0213828 A1 Jul. 27, 2017

Related U.S. Application Data

(60) Provisional application No. 62/281,459, filed on Jan. 21, 2016.

(51) Int. Cl.
*H01L 27/092* (2006.01)
*H01L 29/66* (2006.01)
*H01L 29/423* (2006.01)
*H01L 21/8238* (2006.01)
*H01L 21/3215* (2006.01)

(52) U.S. Cl.
CPC ...... *H01L 27/0924* (2013.01); *H01L 21/3215* (2013.01); *H01L 21/82385* (2013.01); *H01L 21/823821* (2013.01); *H01L 21/823828* (2013.01); *H01L 21/823842* (2013.01); *H01L 21/823864* (2013.01); *H01L 27/0922* (2013.01);
(Continued)

(58) Field of Classification Search
None
See application file for complete search history.

(56) References Cited

U.S. PATENT DOCUMENTS 6,475,841 B1 11/2002 Taylor, Jr. et al.
7,910,422 B2 3/2011 Mehrad et al.
(Continued)

FOREIGN PATENT DOCUMENTS

TW 201436228 A 9/2014
TW 201517272 A 5/2015

*Primary Examiner* — Erik Kielin
(74) *Attorney, Agent, or Firm* — Cooper Legal Group, LLC

(57) ABSTRACT

An integrated circuit includes a substrate, at least one n-type semiconductor device, and at least one p-type semiconductor device. The n-type semiconductor device is present on the substrate. The n-type semiconductor device includes a gate structure having a bottom surface and at least one sidewall. The bottom surface of the gate structure of the n-type semiconductor device and the sidewall of the gate structure of the n-type semiconductor device intersect to form an interior angle. The p-type semiconductor device is present on the substrate. The p-type semiconductor device includes a gate structure having a bottom surface and at least one sidewall. The bottom surface of the gate structure of the p-type semiconductor device and the sidewall of the gate structure of the p-type semiconductor device intersect to form an interior angle smaller than the interior angle of the gate structure of the n-type semiconductor device.

20 Claims, 17 Drawing Sheets

(52) U.S. Cl.
CPC .... *H01L 29/4238* (2013.01); *H01L 29/66545* (2013.01)

(56) References Cited

U.S. PATENT DOCUMENTS

| | | | | |
|---|---|---|---|---|
| 2004/0113212 A1* | 6/2004 | Lee | ............... | H01L 21/28114 257/408 |
| 2008/0166876 A1* | 7/2008 | Jung | ............... | H01L 21/32139 438/684 |
| 2009/0057771 A1* | 3/2009 | Fukasaku | ............... | H01L 21/28097 257/369 |
| 2009/0166629 A1* | 7/2009 | Mehrad | ............... | H01L 21/823842 257/57 |
| 2009/0218603 A1* | 9/2009 | Brask | ............... | H01L 21/30608 257/255 |
| 2010/0068877 A1* | 3/2010 | Yeh | ............... | H01L 29/66545 438/592 |
| 2012/0034747 A1* | 2/2012 | Lin | ............... | H01L 21/28088 438/300 |
| 2012/0208334 A1* | 8/2012 | Rouh | ............... | H01L 21/823842 438/231 |
| 2013/0154011 A1* | 6/2013 | Jou | ............... | H01L 29/42372 257/368 |
| 2013/0299914 A1* | 11/2013 | Kim | ............... | H01L 27/092 257/369 |
| 2017/0053913 A1* | 2/2017 | Min | ............... | H01L 27/0886 |
| 2017/0110576 A1* | 4/2017 | Kim | ............... | H01L 29/401 |
| 2017/0117192 A1* | 4/2017 | Min | ............... | H01L 21/823864 |

\* cited by examiner

INTEGRATED CIRCUIT AND MANUFACTURING METHOD THEREOF

PRIORITY CLAIM AND CROSS-REFERENCE

This application claims priority to U.S. Provisional Application Ser. No. 62/281,459, filed Jan. 21, 2016, which is herein incorporated by reference.

BACKGROUND

Semiconductor devices are small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
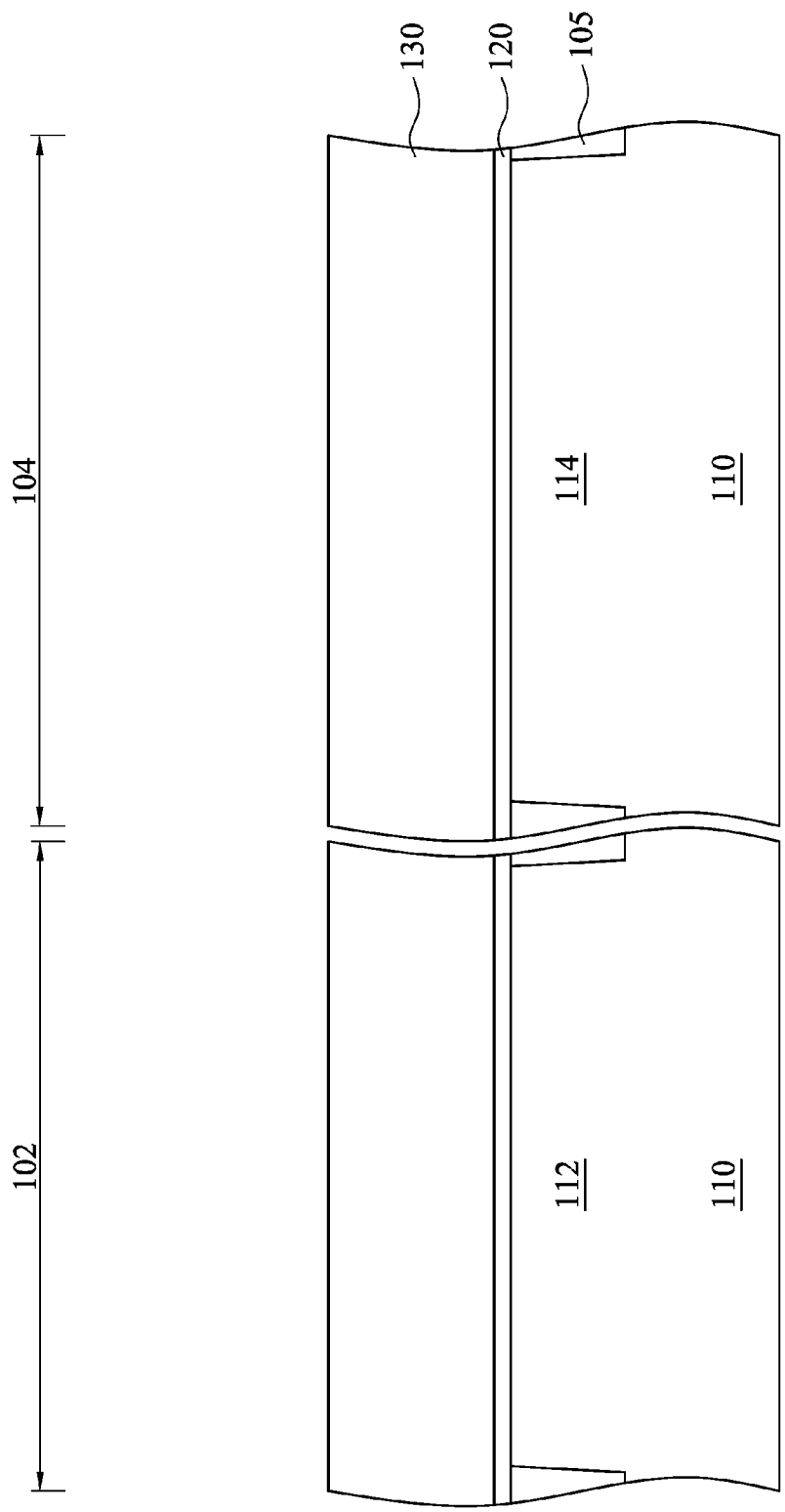
FIGS. 1A to 1M are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIGS. 1A to 1M are cross-sectional views of a method for manufacturing a semiconductor device at various stages in accordance with some embodiments of the present disclosure. Reference is made to FIG. 1A. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

At least one semiconductor fin 112 and at least one semiconductor fin 114 are formed on the substrate 110. In some embodiments, the semiconductor fins 112 and 114 include silicon. The semiconductor fins 112 and 114 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a desired pattern (the semiconductor fins 112 and 114 in this case) and developed to remove portions of the photoresist material. The remaining photoresist material protects the underlying material from subsequent processing steps, such as etching. It should be noted that other masks, such as an oxide or silicon nitride mask, may also be used in the etching process.

An interlayer dielectric 120 is formed to cover the semiconductor fins 112 and 114 and the substrate 110. The interlayer dielectric 120 may be formed by thermal oxidation, chemical vapor deposition, sputtering, or other methods known and used in the art for forming a gate dielectric. Depending on the technique of dielectric layer formation, the thickness of the interlayer dielectric 120 on the top of the semiconductor fins 112 and 114 may be different from the thickness of the interlayer dielectric 120 on the sidewall (not shown) of the semiconductor fins 112 and 114. The interlayer dielectric 120 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide (HfO$_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), silicon nitride (Si$_3$N$_4$), oxynitrides (SiON), and combinations thereof. The interlayer dielectric 120 may have a multilayer structure such as one layer of silicon oxide (e.g., interfacial layer) and another layer of high-k material. The interlayer dielectric 120 may be formed using chemical vapor deposition (CVD), physical vapor deposition (PVD), atomic layer deposition (ALD), thermal oxide, ozone oxidation, other suitable processes, or combinations thereof.

A dummy gate layer 130 is formed on the interlayer dielectric 120. The dummy gate layer 130 has at least one n-type portion 102 and at least one p-type portion 104. For example, in FIG. 1A, the dummy gate layer 130 has one n-type portion 102 and one p-type portion 104. The dummy gate layer 130 may be deposited by chemical vapor deposition (CVD), by sputter deposition, or by other techniques known and used in the art for depositing conductive materials. The dummy gate layer 130 may include polycrystalline-silicon (poly-Si) or poly-crystalline silicon-germanium (poly-SiGe).

Figure 1B:
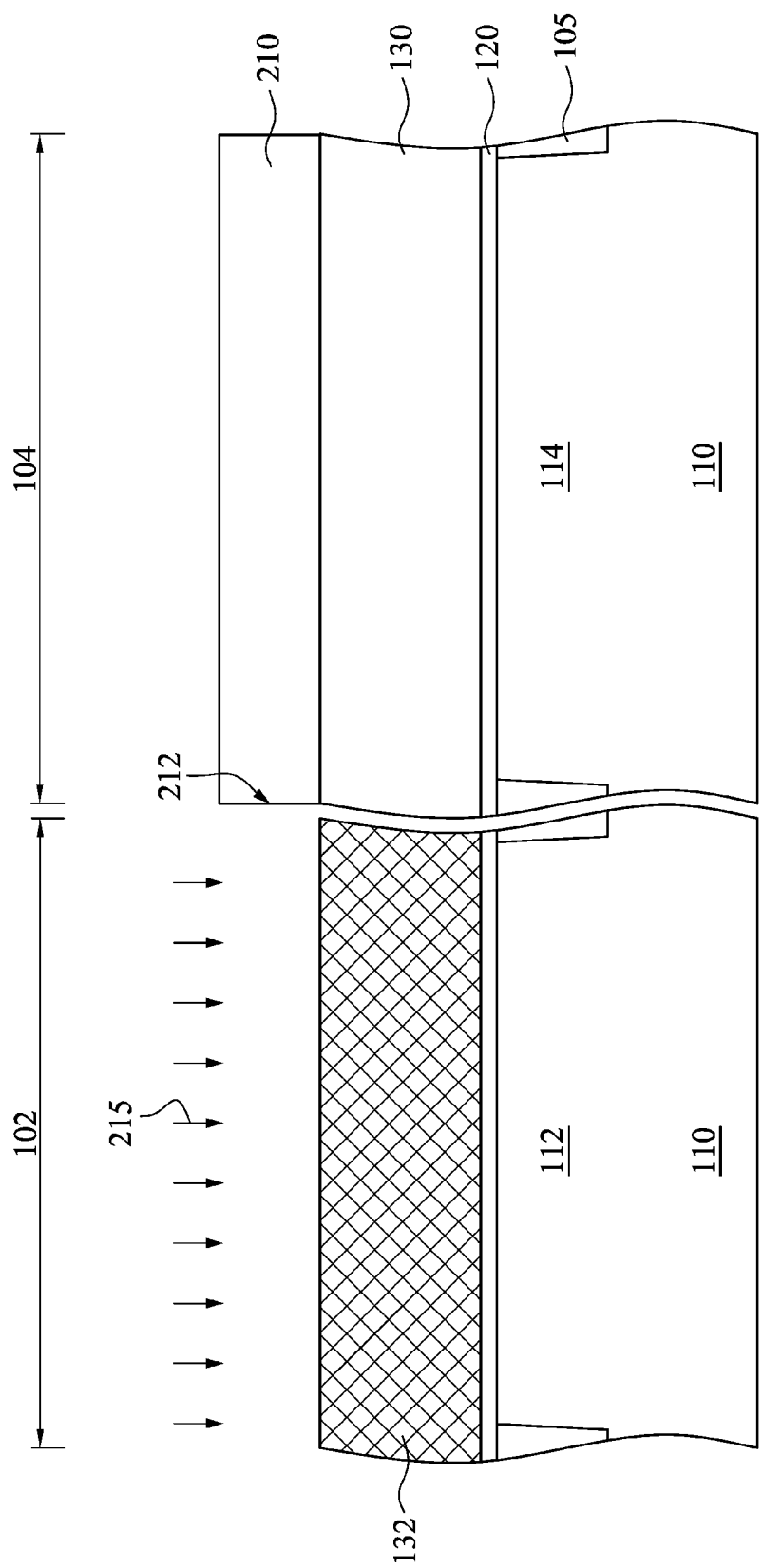

Reference is made to FIG. 1B. A mask layer 210 is formed on a portion of the dummy gate layer 130 present outside the n-type portion 102 of the dummy gate layer 130. The mask layer 210 can be a resist layer, which is also referred to as a photoresist layer, photosensitive layer, imaging layer, patterning layer, or radiation sensitive layer. The mask layer 210 includes a positive-type resist material, a negative-type resist material, other type material, or combinations thereof. The mask layer 210 is formed on the dummy gate layer 130 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer. In some embodiments, the lithography process implements an etching process, such as a dry etching, wet etching, other etching method, or combinations thereof. A rinsing process, such as a de-ionized (DI) water rinse, may be performed on the dummy gate layer 130 before forming the mask layer 210.

The mask layer 210 includes an opening 212 that exposes the n-type portion 102 of the dummy gate layer 130. In FIG. 1B, an ion implantation process (or doping process) 215 is performed on the dummy gate layer 130 using the mask layer 210 as a mask. In FIG. 1B, the ion implantation process 215 forms a doped region 132 with a plurality of first dopants. The first dopants include B, P, As, or combinations thereof.

Figure 1C:
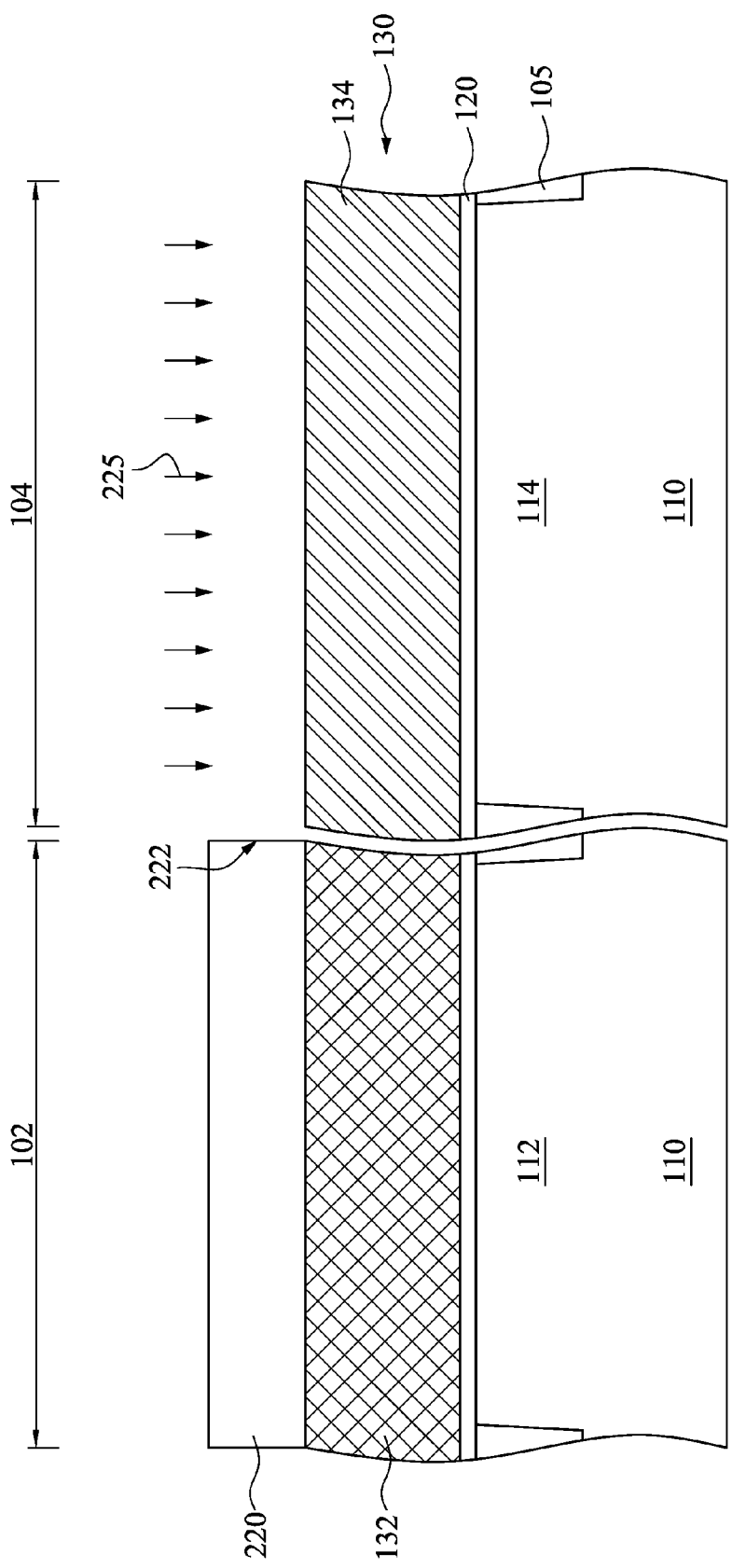

Reference is made to FIG. 1C. The mask layer 210 (see FIG. 1B) is removed. In some embodiments, the mask layer 210 is removed by performing a wet etching process. In some embodiments, wet etch solution for the wet etching process includes a Caros solution, including sulfuric acid (H$_2$SO$_4$) and peroxide (H$_2$O$_2$). Alternatively, the mask layer 210 is removed by a chemical solution selected from O$_3$ water, sulfuric acid (H$_2$SO$_4$) and ozone (O$_3$), H$_2$SO$_4$ and H$_2$O$_2$, N-methyl-2-pyrrolidine (NMP), cyclohexanol, cyclopentanol, propylene glycol monomethyl ether (PGME), and Propylene glycol monomethyl ether acetate (PGMEA). In some other embodiment, the mask layer 210 is removed by a chemical solution selected from oxidant based solution. In some embodiments, a cleaning process is performed to clean organic residue or other residues after the removal of the mask layer 210. The cleaning material is capable of removing the organic residue. The cleaning material may include solvent, surfactant or polymer ingredient.

Another mask layer 220 is formed on a portion of the dummy gate layer 130 present outside the p-type portion 104 of the dummy gate layer 130. The mask layer 220 can be a resist layer, which is also referred to as a photoresist layer, photosensitive layer, imaging layer, patterning layer, or radiation sensitive layer. The mask layer 220 includes a positive-type resist material, a negative-type resist material, other type material, or combinations thereof. The mask layer 220 is formed on the dummy gate layer 130 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer. In some embodiments, the lithography process implements an etching process, such as a dry etching, wet etching, other etching method, or combinations thereof. A rinsing process, such as a de-ionized (DI) water rinse, may be performed on the dummy gate layer 130 before forming the mask layer 220.

The mask layer 220 includes an opening 222 that exposes the p-type portion 104 of the dummy gate layer 130. In FIG. 1C, another ion implantation process (or doping process) 225 is performed on the dummy gate layer 130 using the mask layer 220 as a mask. In FIG. 1C, the ion implantation process 225 forms another doped region 134 with a plurality of second dopants. The second dopants include B, P, As, or combinations thereof.

Figure 1D:
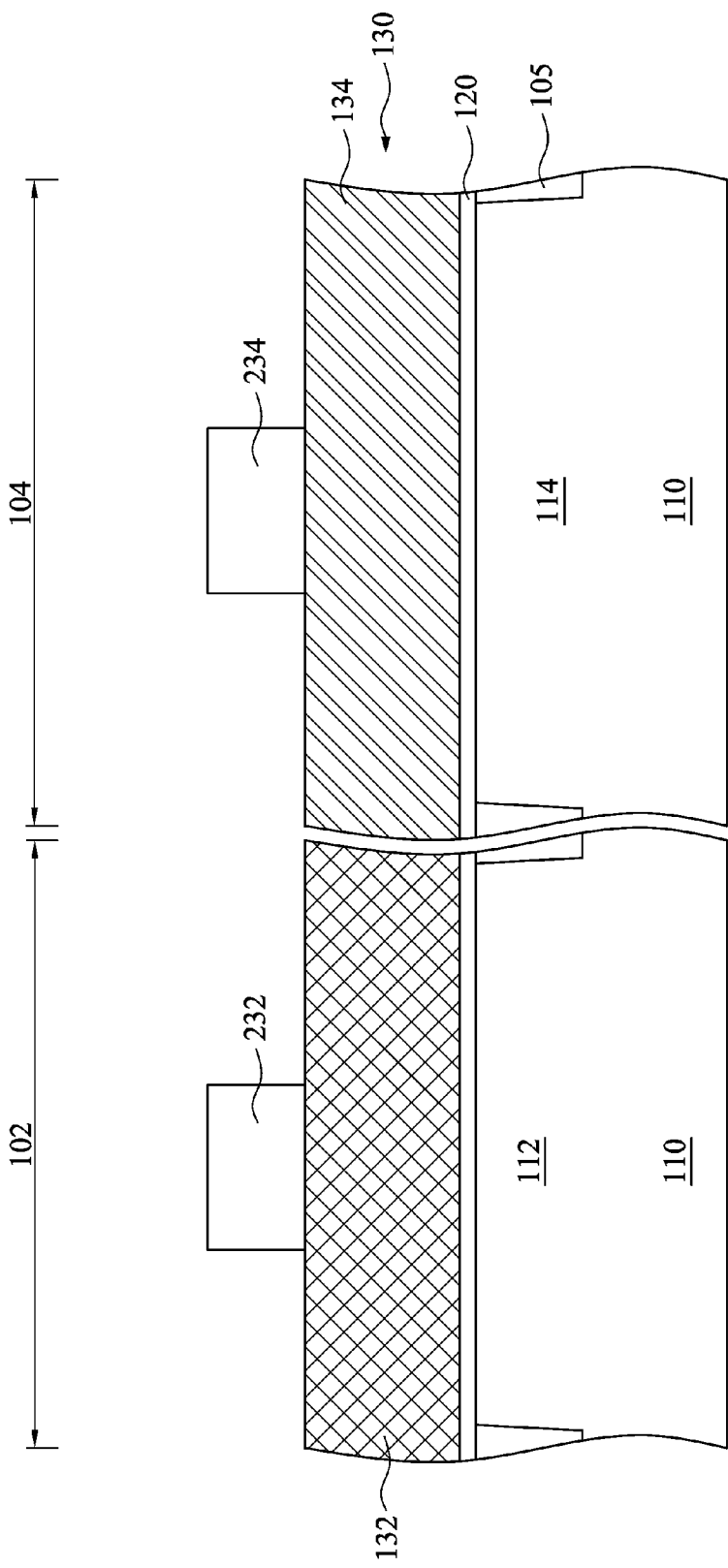

Reference is made to FIG. 1D. The mask layer 220 (see FIG. 1C) is removed. In some embodiments, the mask layer 220 is removed by performing a wet etching process. In some embodiments, wet etch solution for the wet etching process includes a Caros solution, including sulfuric acid (H$_2$SO$_4$) and peroxide (H$_2$O$_2$). Alternatively, the mask layer 220 is removed by a chemical solution selected from O$_3$ water, sulfuric acid (H$_2$SO$_4$) and ozone (O$_3$), H$_2$SO$_4$ and H$_2$O$_2$, N-methyl-2-pyrrolidine (NMP), cyclohexanol, cyclopentanol, propylene glycol monomethyl ether (PGME), and Propylene glycol monomethyl ether acetate (PGMEA). In some other embodiment, the mask layer 220 is removed by a chemical solution selected from oxidant based solution. In some embodiments, a cleaning process is performed to clean organic residue or other residues after the removal of the mask layer 220. The cleaning material is capable of removing the organic residue. The cleaning material may include solvent, surfactant or polymer ingredient.

A patterned mask layer is then formed on the doped regions 132 and 134 of the dummy gate layer 130. The patterned mask layer includes masks 232 and 234. The mask 232 is present on the doped region 132 of the dummy gate layer 130, and the mask 234 is present on the doped region 134 of the dummy gate layer 130. The masks 232 and 234 respectively define profiles of gate structures present on the semiconductor fins 112 and 114.

Figure 1E:
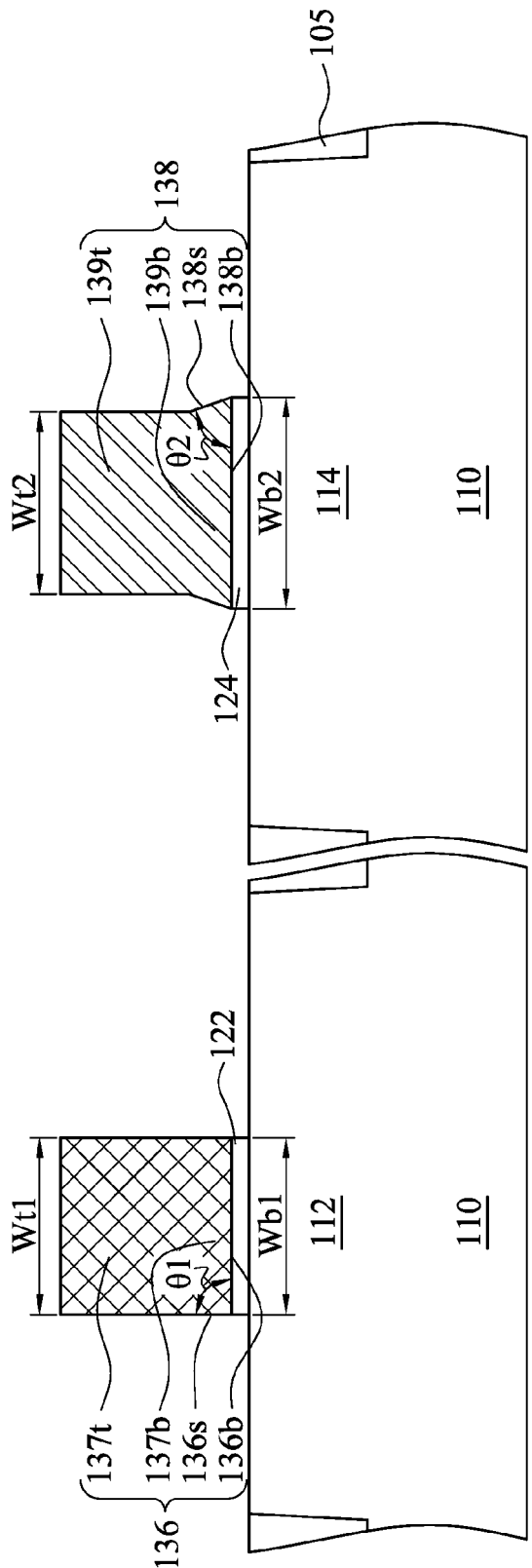

Reference is made to FIG. 1E. The doped regions 132 and 134 of the dummy gate layer 130 of FIG. 1D are then patterned to respectively form a dummy gate structure 136 and a dummy gate structure 138 by using the masks 232 and 234 of FIG. 1D. The doped regions 132 and 134 may be patterned by an etching process, such as a dry plasma etching process or a wet etching process.

After the patterning process, the masks 232 and 234 of FIG. 1D may then be removed. The portion of the interlayer dielectric 120 not covered by the dummy gate structures 136 and 138 may or may not be removed during the etching process. In the case where some interlayer dielectric 120 remains on the semiconductor fins 112 and 114 not covered by the dummy gate structures 136 and 138, the interlayer dielectric 120 may be subsequently removed by dry or wet etching to form gate dielectrics 122 and 124.

Since the doped regions 132 and 134 of the dummy gate layer 130 of FIG. 1D include different types of dopants, the etching rates of the doped regions 132 and 134 are different. Hence, when the doped regions 132 and 134 are etched together, the dummy gate structures with different profiles (i.e., the dummy gate structures 136 and 138) can be formed during the same etching process. For example, in FIG. 1E, the dummy gate structure 136 has substantially vertical sidewalls while the dummy gate structure 138 has a footing profile.

In greater detail, the dummy gate structure 136 has a bottom surface 136b and at least one sidewall 136s. The bottom surface 136b and the sidewall 136s intersect to form an interior angle θ1. The interior angle θ1 is an angle inside the dummy gate structure 136. In FIG. 1E, the interior angle θ1 is a substantially right angle. That is, the interior angle θ1 is substantially 90 degrees. To describe from another point of view, the dummy gate structure 136 includes a top portion 137t and a bottom portion 137b disposed between the top portion 137t and the substrate 110. The top portion 137t has a width Wt1, and the bottom portion 137b has a width Wb1. The width Wb1 of the bottom portion 137b is substantially the same as the width Wt1 of the top portion 137t. The term "substantially" as used herein may be applied to modify any quantitative representation which could permissibly vary without resulting in a change in the basic function to which it is related.

Moreover, the dummy gate structure 138 has a bottom surface 138b and at least one sidewall 138s. The bottom surface 138b and the sidewall 138s intersect to form an interior angle θ2. The interior angle θ2 is an angle inside the dummy gate structure 138. In FIG. 1E, the interior angle θ2 is an acute angle. That is, the interior angle θ2 is smaller than 90 degrees. To describe from another point of view, the dummy gate structure 138 includes a top portion 139t and a bottom portion 139b disposed between the top portion 139t and the substrate 110. The top portion 139t has a width Wt2, and the bottom portion 139b has a width Wb2. The width Wb2 of the bottom portion 139b is greater than the width Wt2 of the top portion 139t.

Figure 2A:
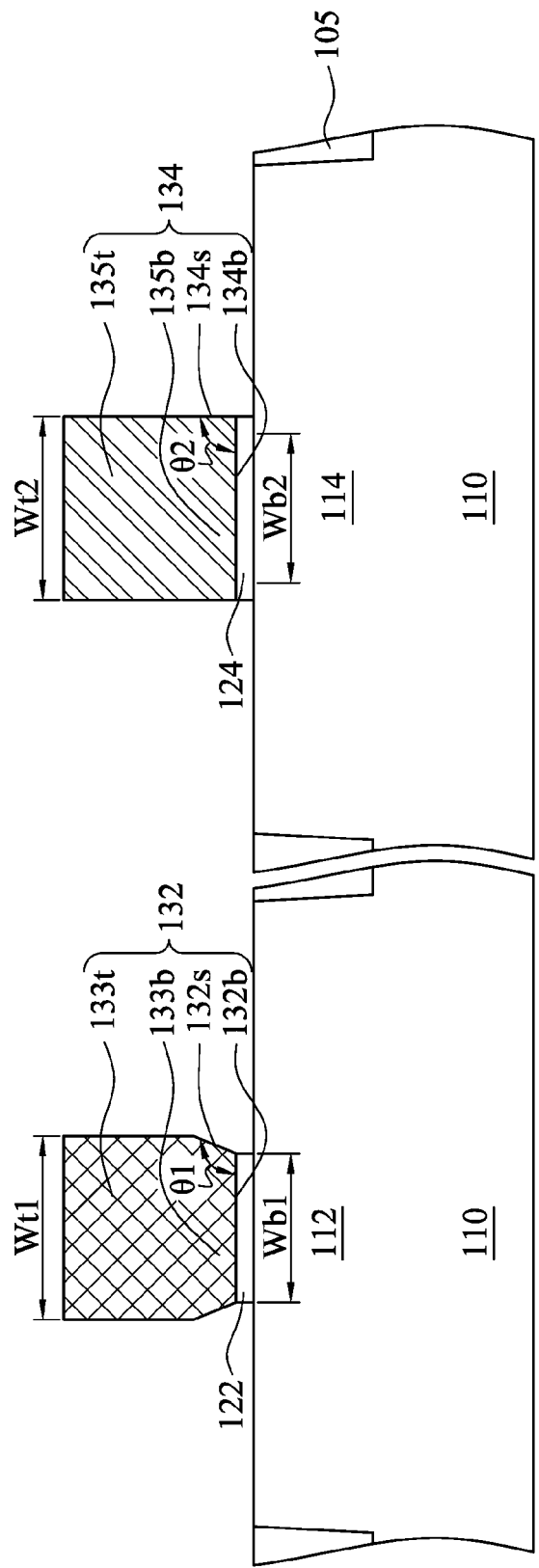
FIGS. 2A and 2B are cross-sectional views of the semiconductor device at stage of FIG. 1E in accordance with some embodiments of the present disclosure.
Figure 2B:
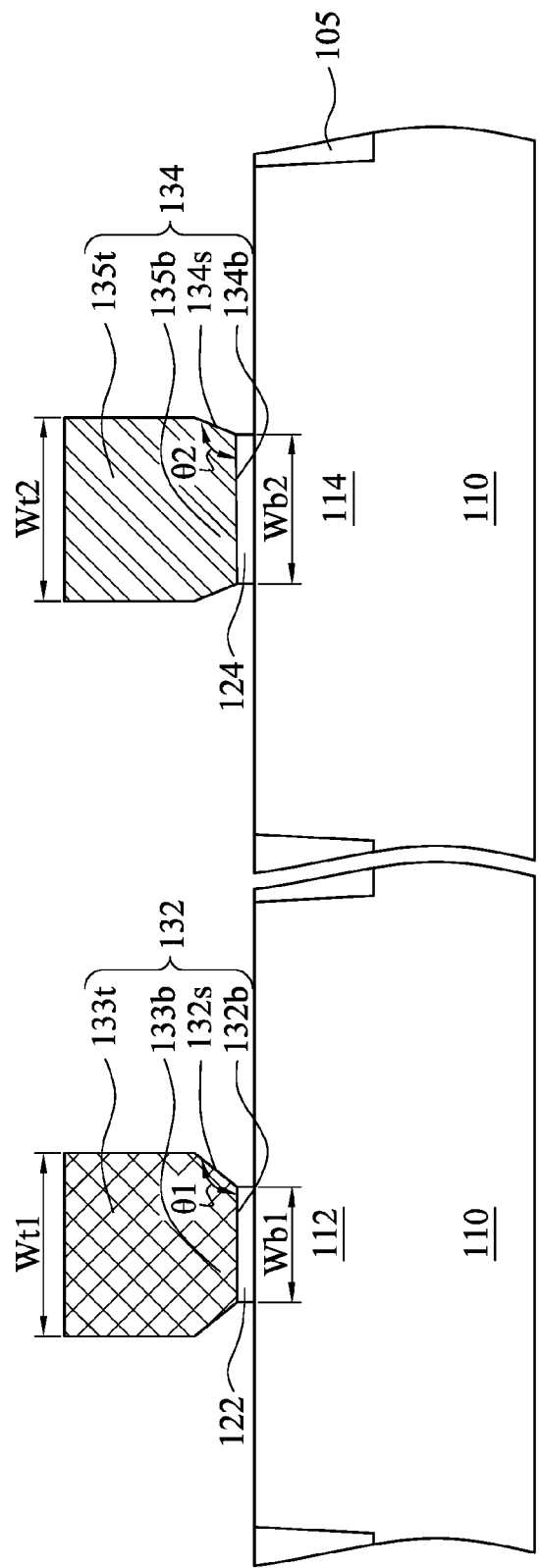

However, the profile of the dummy gate structures 136 and 138 are not limited in this respect. FIGS. 2A and 2B are cross-sectional views of the semiconductor device at stage of FIG. 1E in accordance with some embodiments of the present disclosure. In FIGS. 2A and 2B, the interior angles θ1 are obtuse angles. That is, the interior angles θ1 are greater than 90 degrees. Furthermore, the width Wb1 of the bottom portion 137b is narrower than the width Wt1 of the top portion 137t. Hence, the dummy gate structures 136 in FIGS. 2A and 2B have notch profiles.

Moreover, in FIG. 2A, the interior angles θ2 has a substantially right angle. That is, the interior angle θ2 is substantially 90 degrees. Furthermore, the width Wb2 of the bottom portion 139b is substantially the same as the width Wt2 of the top portion 139t. In FIG. 2B, the interior angle θ2 is an obtuse angle. That is, the interior angle θ2 is greater than 90 degrees. Furthermore, the width Wb2 of the bottom portion 139b is narrower than the width Wt2 of the top portion 139t. Hence, the dummy gate structure 138 in FIG. 2B has a notch profile.

In FIGS. 1E, 2A, and 2B, the interior angle θ1 is greater than the interior angle θ2. Furthermore, the widths Wb1, Wb2, Wt1, and Wt2 satisfy the relationship of (Wb2−Wt2)>(Wb1−Wt1). Moreover, the width Wt1 of the dummy gate structure 136 is substantially the same as the width Wt2 of the dummy gate structure 138.

Figure 1F:
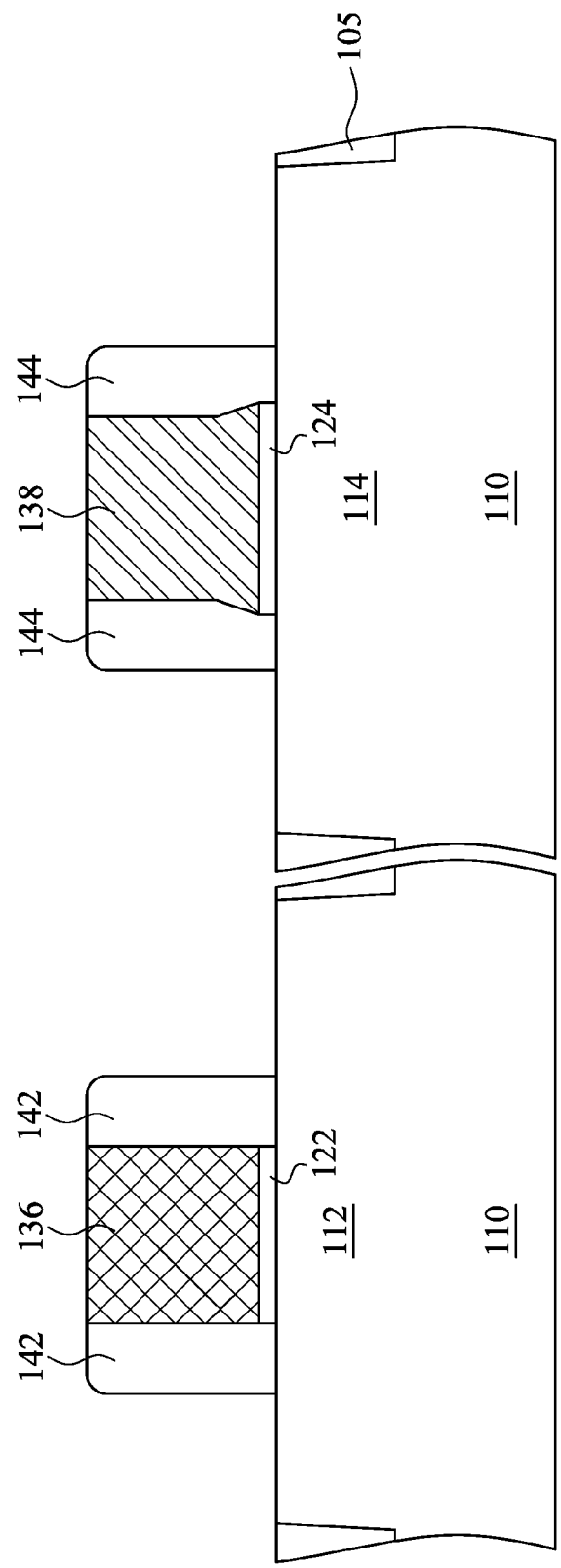

Reference is made to FIG. 1F. A pair of gate spacers 142 is formed on the substrate 110 and along the dummy gate structure 136, and a pair of gate spacers 144 is formed on the substrate 110 and along the dummy gate structure 138. In some embodiments, the gate spacers 142 and 144 may include silicon oxide, silicon nitride, silicon oxy-nitride, or other suitable material. The gate spacers 142 and 144 may include a single layer or multilayer structure. To form the gate spacers 142 and 144, a blanket layer may be formed on the substrate 110 by CVD, PVD, ALD, or other suitable technique. Then, an anisotropic etching is performed on the blanket layer to form the gate spacers 142 and 144 respectively on two sides of the dummy gate structures 136 and 138. In some embodiments, the gate spacers 142 and 144 are used to offset subsequently formed doped regions, such as source/drain regions. The gate spacers 142 and 144 may further be used for designing or modifying the source/drain region (junction) profile.

Figure 1G:
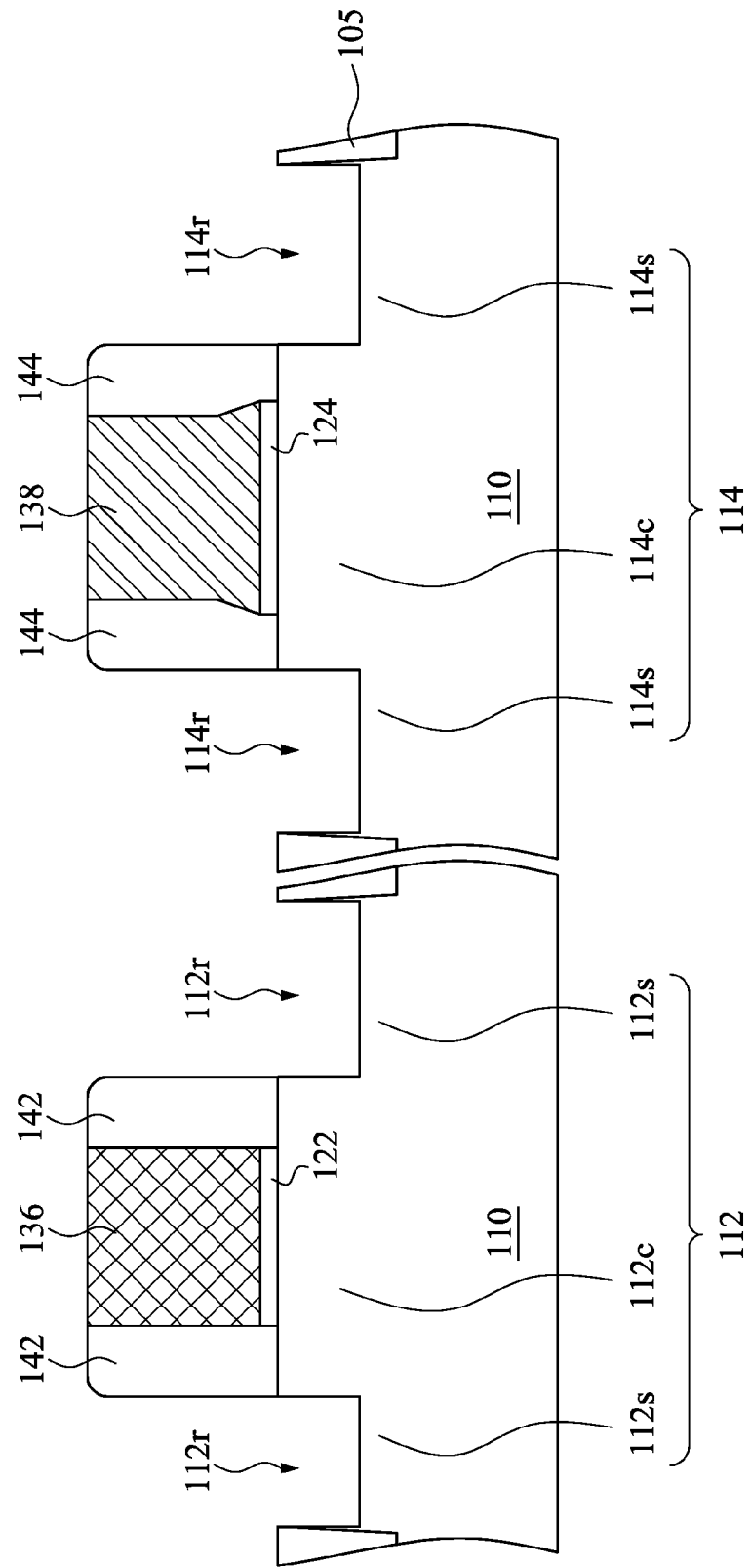

Reference is made to FIG. 1G. Portions of the semiconductor fins 112 and 114 exposed both by the dummy gate structures 136 and 138 and the gate spacers 142 and 144 are removed (or recessed) to form recesses 112r and 114r in the substrate 110. Any suitable amount of material may be removed. The remaining semiconductor fin 112 has a plurality of source/drain portions 112s and a channel portion 112c, and the remaining semiconductor fin 114 has a plurality of source/drain portions 114s and a channel portion 114c. The source/drain portions 112s and 114s are embedded in the substrate 110 and portions thereof are exposed by the recesses 112r and 114r. The channel portions 112c and 114c are respectively disposed under the dummy gate structures 136 and 138.

Removing portions of the semiconductor fins 112 and 114 may include forming a photoresist layer or a capping layer (such as an oxide capping layer) over the structure of FIG. 1F, patterning the photoresist or capping layer to have openings that expose a portion of the semiconductor fins 112 and 114, and etching back material from the semiconductor fins 112 and 114. In some embodiments, the semiconductor fins 112 and 114 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112r and 114r with HF or other suitable solution.

Figure 1H:
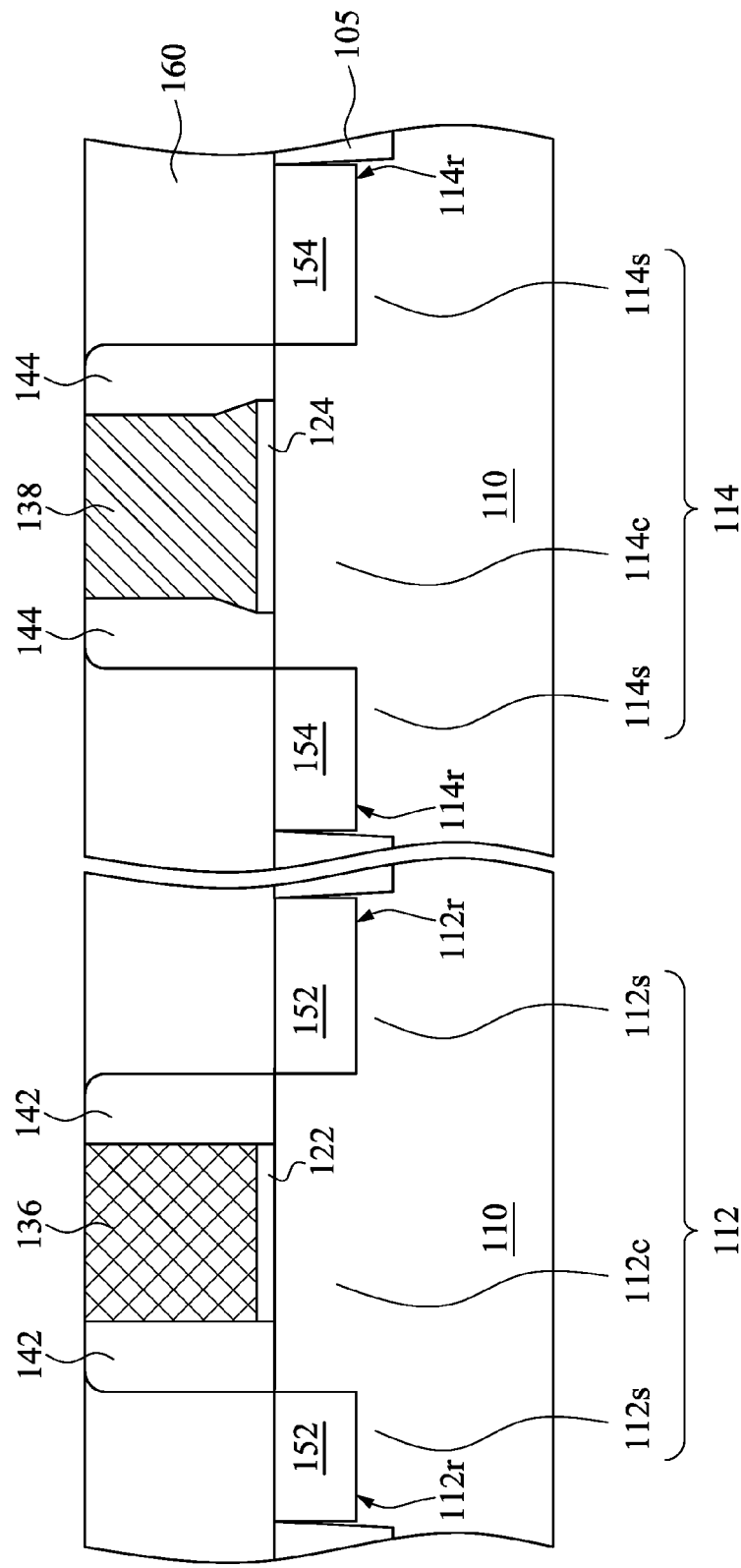

Reference is made to FIG. 1H. A plurality of epitaxy structures 152 and 154 are respectively formed in the recesses 112r and 114r and on the source/drain portions 112s and 114s of the semiconductor fins 112 and 114. The epitaxy structures 152 and 154 may be formed using one or more epitaxy or epitaxial (epi) processes, such that Si features, SiGe features, and/or other suitable features can be formed in a crystalline state on the source/drain portions 112s and 114s of the semiconductor fins 112 and 114. In some embodiments, the lattice constant of the epitaxy structures 152 and 154 are different from the lattice constant of the semiconductor fins 112 and 114, and the epitaxy structures 152 and 154 are strained or stressed to enable carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 112s and 114s of the semiconductor fins 112 and 114 (e.g., silicon). Thus, a strained channel can be achieved to increase carrier mobility and enhance device performance. The epitaxy structures 152 and 154 may be in-situ doped. The doping species include p-type dopants, such as boron or $BF_2$; n-type dopants, such as phosphorus or arsenic; and/or other suitable dopants including combinations thereof. If the epitaxy structures 152 and 154 are not in-situ doped, a second implantation process (i.e., a junction implant process) is performed to dope the epitaxy structures 152 and 154. One or more annealing processes may be performed to activate the epitaxy structures 152 and 154. The annealing processes include rapid thermal annealing (RTA) and/or laser annealing processes.

Then, a dielectric layer 160 is formed at outer sides of the gate spacers 142 and 144 and on the substrate 110. The dielectric layer 160 includes silicon oxide, oxynitride or other suitable materials. The dielectric layer 160 includes a single layer or multiple layers. The dielectric layer 160 is formed by a suitable technique, such as CVD or ALD. A chemical mechanical planarization (CMP) process may be applied to remove excessive dielectric layer 160 and expose the top surface of the dummy gate structures 132 and 134 to a subsequent dummy gate removing process.

Figure 1I:
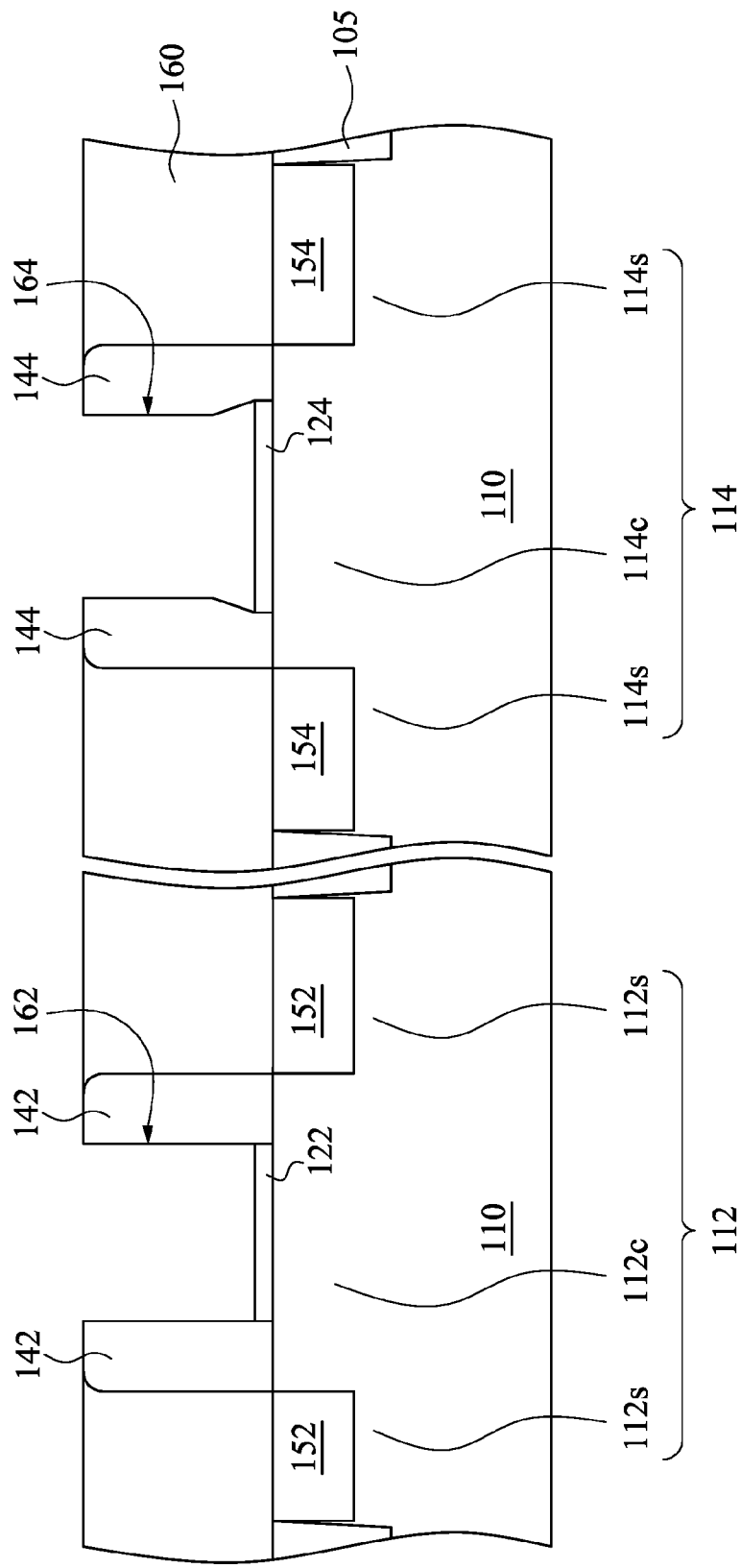

Reference is made to FIG. 1I, the dummy gate structures 136 and 138 (see FIG. 1H) are removed to form an opening 162 with the gate spacers 142 as its sidewall and an opening 164 with the gate spacers 144 as its sidewall. The openings 162 and 164 have different profiles. Or, the opening 164 has a larger accommodate window than the opening 162. In some embodiments, the gate dielectrics 122 and 124 are removed as well. Alternatively, in some embodiments, the dummy gate structures 136 and 138 are removed while the gate dielectrics 122 and 124 retains as shown in FIG. 1I. The dummy gate structures 136 and 138 (and the gate dielectrics 122 and 124) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 1J:
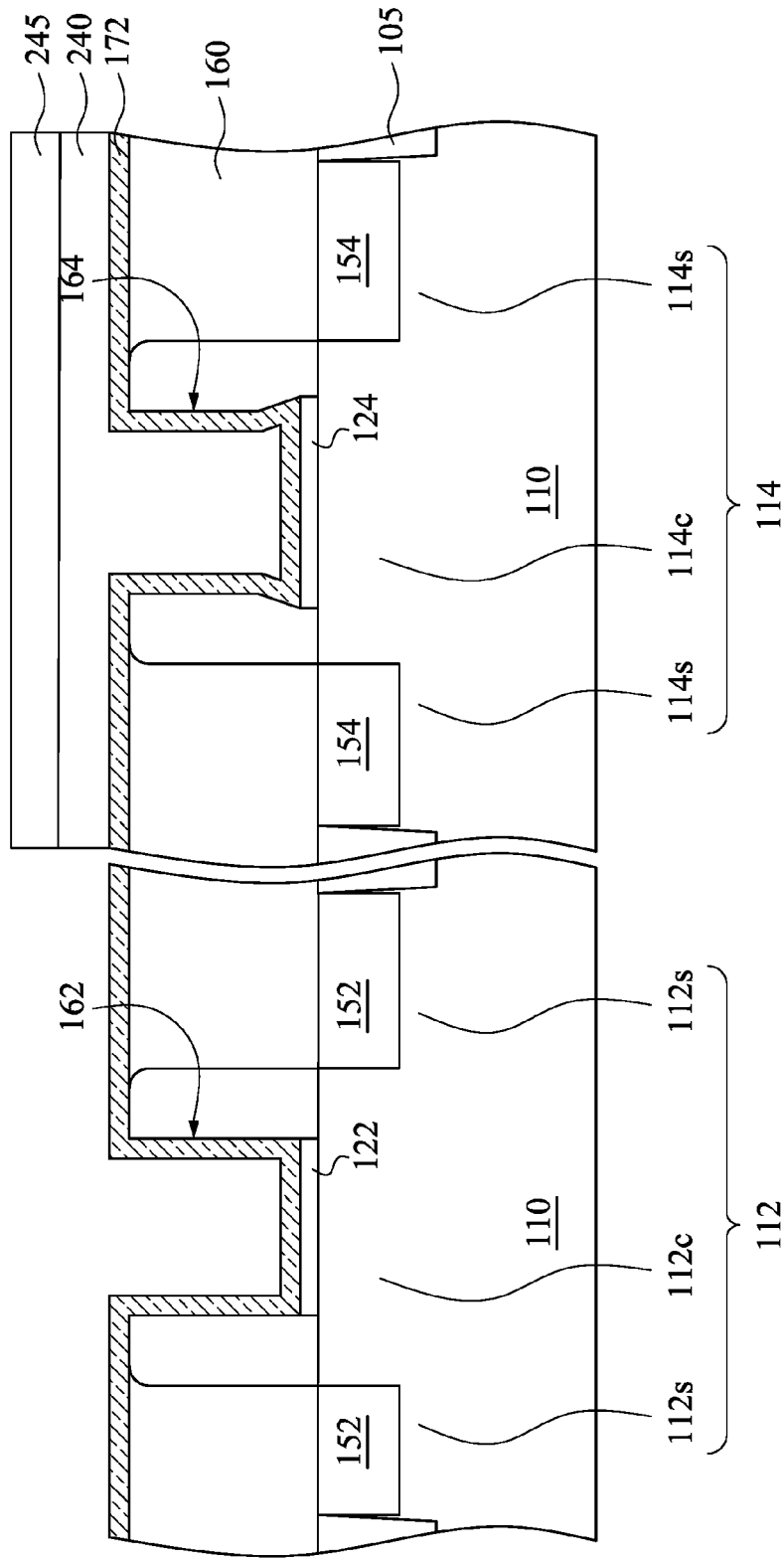

Reference is made to FIG. 1J. A protection layer (not shown) and a p-type work function material 172 can be formed over the structure shown in FIG. 1I. The protection layer, for example TaN, may protect the underlying structure during a later process of defining the p-type work function metallic layer 172p (see FIG. 1K). The p-type work function material 172 can provide a desired work function value for a metal gate structure of a p-type semiconductor device 20 (see FIG. 1M). The protection material and the p-type work function material 172 can be formed by suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In some embodiments, the p-type work function material 172 can be made of TiN, Co, WN, or TaC.

A dielectric material 240, e.g. spin-on-glass (SOG), can be formed, covering a portion of the p-type work function material 172 and filling the opening 164. A photoresist 245 can be defined over the dielectric material 240. The dielectric material 240 and/or the photoresist 245 can be provided for patterning the p-type work function material 172 for the p-type semiconductor device 20. The dielectric material 240 and the photoresist 245 can be defined by, for example, a spin-on process, a photolithographic process, and an etch process.

Figure 1K:
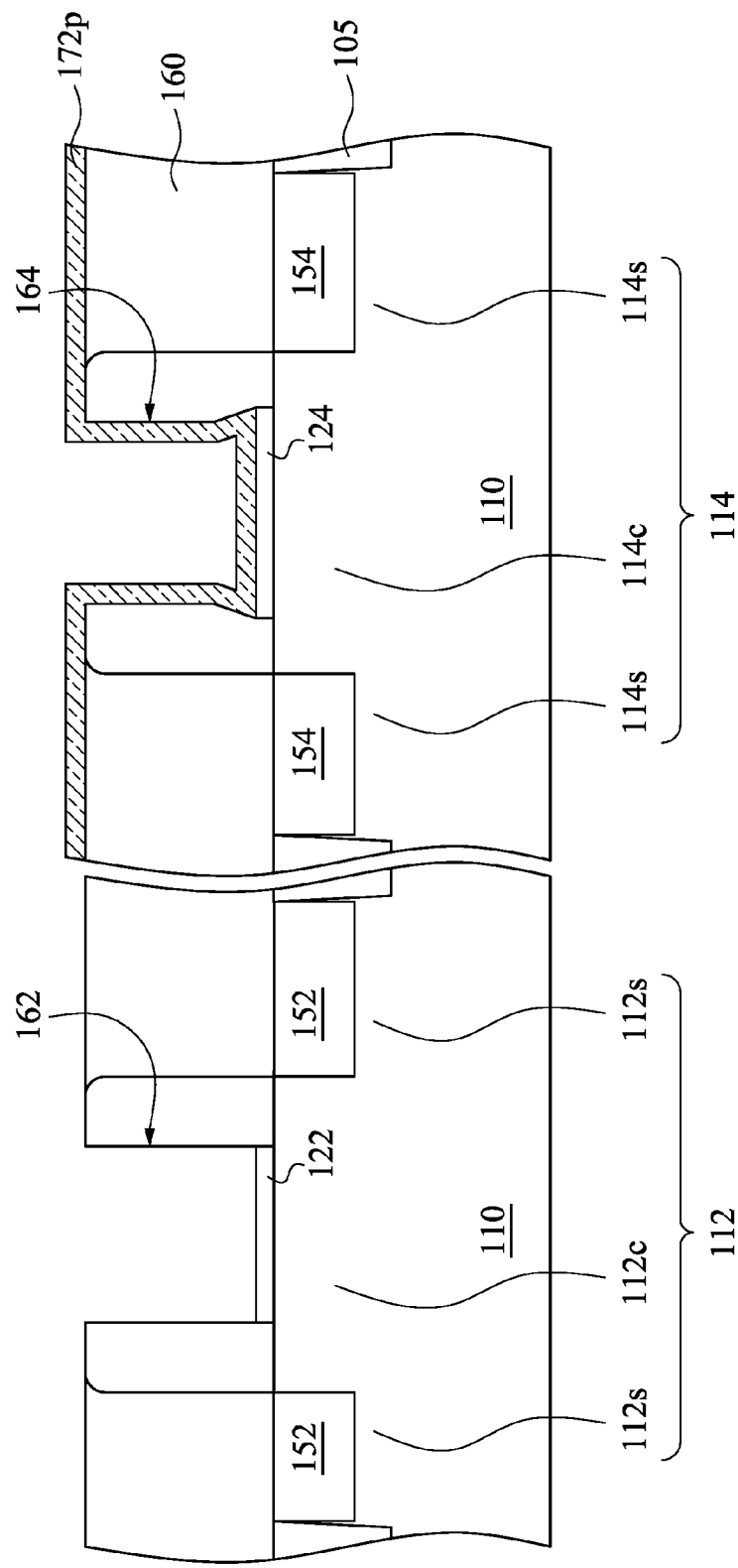

Reference is made to FIG. 1K. A portion of the p-type work function material 172 that is not covered by the dielectric material 240 and the photoresist 240 of FIG. 1J can be removed, defining the p-type work function metallic layer 172p. After defining the p-type work function metallic layer 172p, the dielectric material 240 and the photoresist 245 of FIG. 1J can be removed by a wet etch process, a dry etch process, and/or combinations thereof, exposing the p-type work function metallic layer 172p.

Figure 1L:
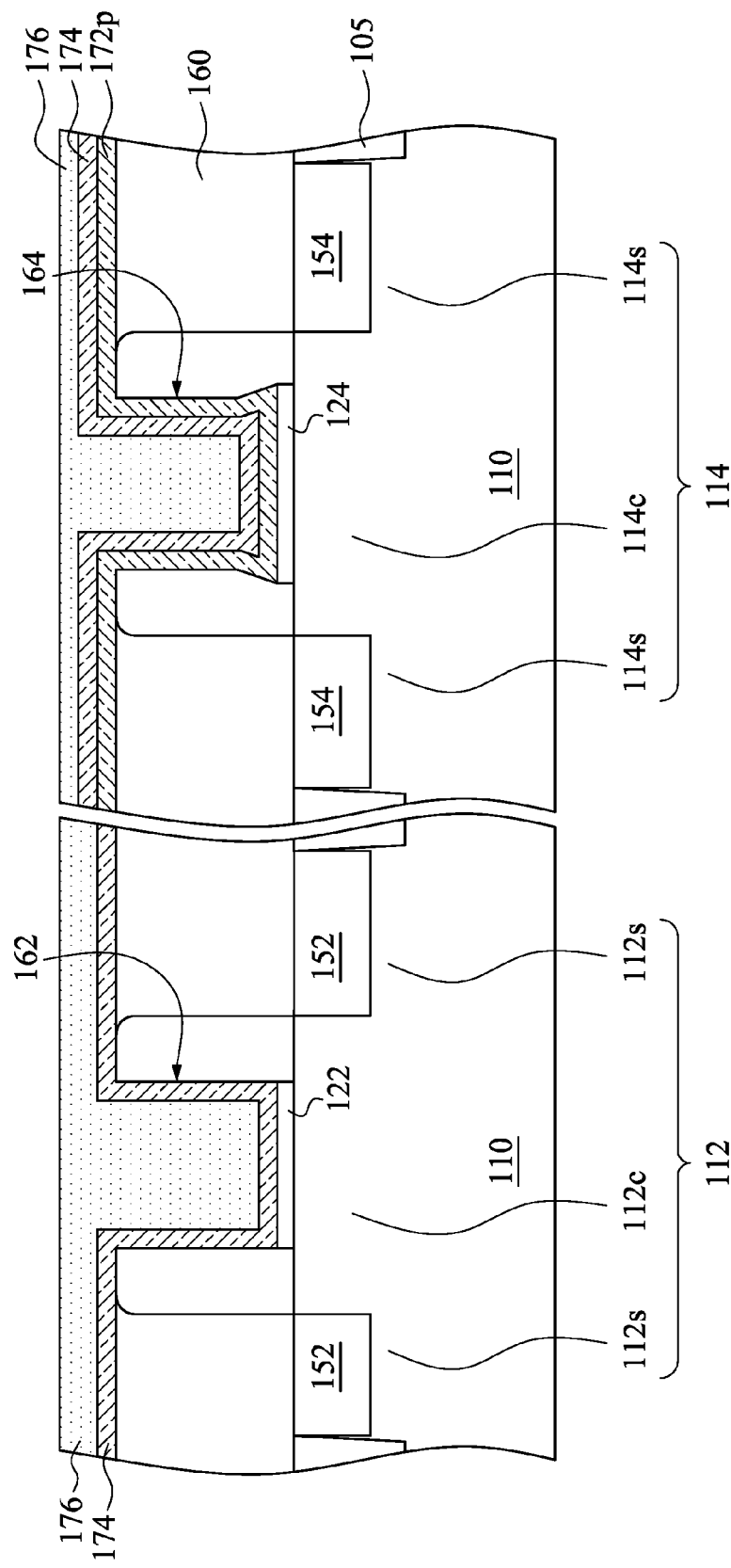

Reference is made to FIG. 1L. An n-type work function material 174 can be formed over the structure shown in FIG. 1K. The n-type work function material 174 can provide a desired work function value for a metal gate structure of an n-type semiconductor device 10 (see FIG. 1M). The n-type work function material 174 can be formed by suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In some embodiments, the n-type work function material 174 can be made of Ti, Al, or TiAl.

The remaining openings 162 and 164 are then filled with a metal layer 176. In some embodiments, the metal layer 176 includes tungsten (W). The metal layer 176 is deposited by ALD, PVD, CVD, or other suitable process. In some other embodiments, the metal layer 176 includes aluminum (Al), copper (Cu) or other suitable conductive material.

Figure 1M:
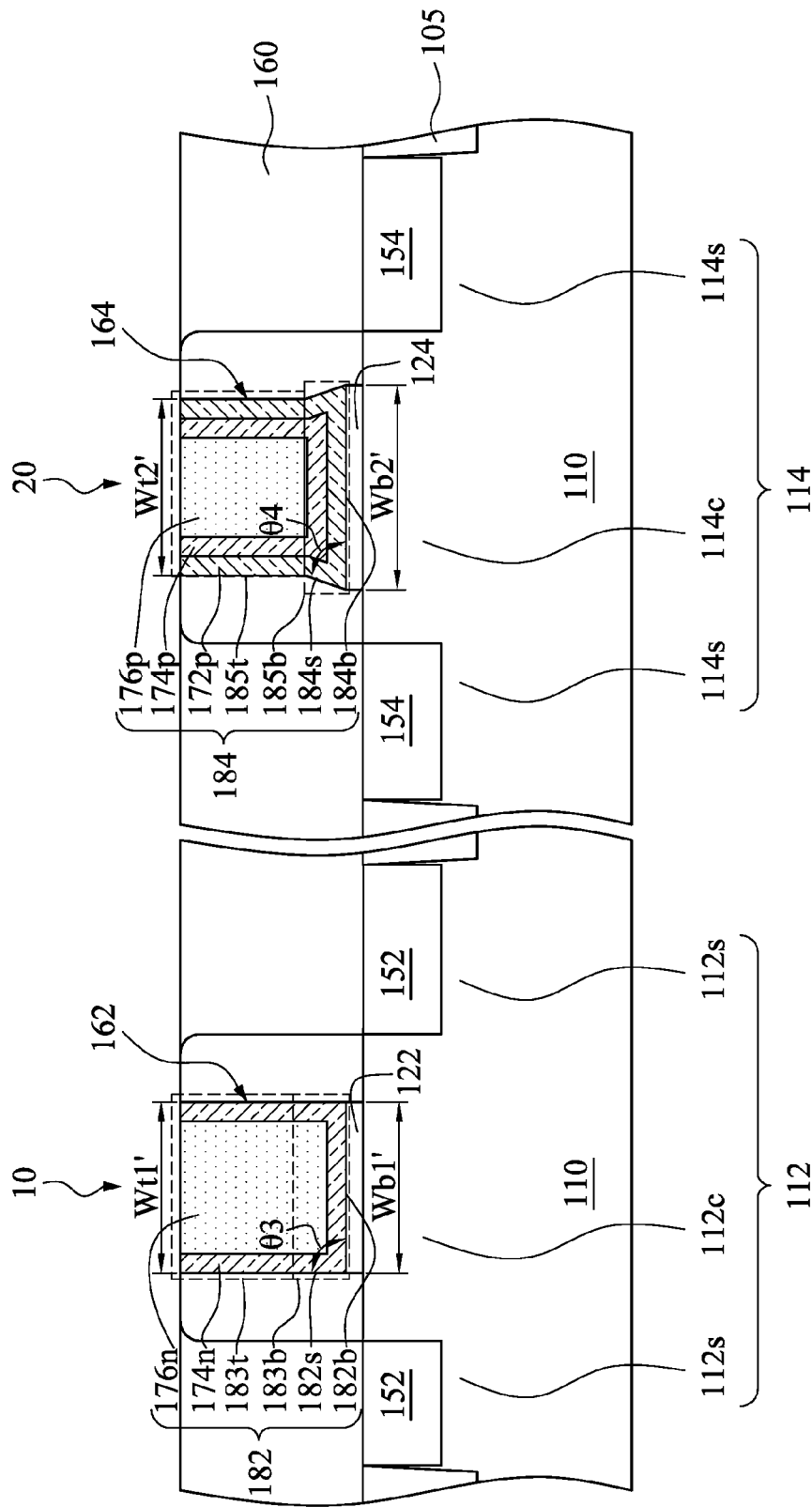

Reference is made to FIG. 1M. In some embodiments, a CMP process is applied to remove excessive the p-type work function metallic layer 172p, the n-type work function material 174 and the metal layer 176 of FIG. 1L to provide a substantially planar top surface for the p-type work function metallic layer 172p, the n-type work function metallic layers 174n and 174p and the metal layers 176n and 176p. The remaining n-type work function metallic layers 174n and the metal layer 176n form a metal gate structure 182 present in the opening 162, and the remaining p-type work function metallic layer 172p, the n-type work function metallic layers 174p, and the metal layer 176p form a metal gate structure 184 present in the opening 162. It is noted that the formation of the metal gate structures 182 and 184 mentioned above is illustrative, and should not limit the claimed scope of the present disclosure. A person having ordinary skill in the art may select a suitable formation process for the metal gate structures 182 and 184 according to actual situations.

In FIG. 1M, the semiconductor fin 112, the epitaxy structures 152, and the metal gate structure 182 (or the dummy gate structure 136 of FIG. 1E) form the n-type semiconductor device 10, and the semiconductor fin 114, the epitaxy structures 154, and the metal gate structure 184 (or the dummy gate structure 138 of FIG. 1E) form the p-type semiconductor device 20. In FIG. 1M, both of the n-type semiconductor device 10 and the p-type semiconductor device 20 are finFETs, and the n-type semiconductor device 10 and the p-type semiconductor device 20 can form a complementary metal-oxide-semiconductor (CMOS) device.

In FIG. 1M, since the opening 164 has a larger accommodate window than the opening 162, more layers or materials can be present in the opening 164. For example, in FIG. 1M, the metal gate structure 184 includes at least three layers (i.e., the p-type work function metallic layer 172p, the n-type work function metallic layers 174p, and the metal layer 176p), and the metal gate structure 182 includes at least two layers (i.e., the n-type work function metallic layers 174n and the metal layer 176n). With such configuration, the electrical properties, such as the on current (Ion) and the off current (Ioff), of the n-type semiconductor device 10 and the p-type semiconductor device 20 can be improved.

In FIG. 1M, the metal gate structure 182 has a bottom surface 182b and at least one sidewall 182s. The bottom surface 182b and the sidewall 182s intersect to form an interior angle $\theta3$. The interior angle $\theta3$ is an angle inside the metal gate structure 182. In FIG. 1M, the interior angle $\theta3$ is a substantially right angle. That is, the interior angle $\theta3$ is substantially 90 degrees. To describe from another point of view, the metal gate structure 182 includes a top portion 183t and a bottom portion 183b disposed between the top portion 183t and the substrate 110. The top portion 183t has a width Wt1', and the bottom portion 183b has a width Wb1'. The width Wb1' of the bottom portion 183b is substantially the same as the width Wt1' of the top portion 183t.

Figure 3A:
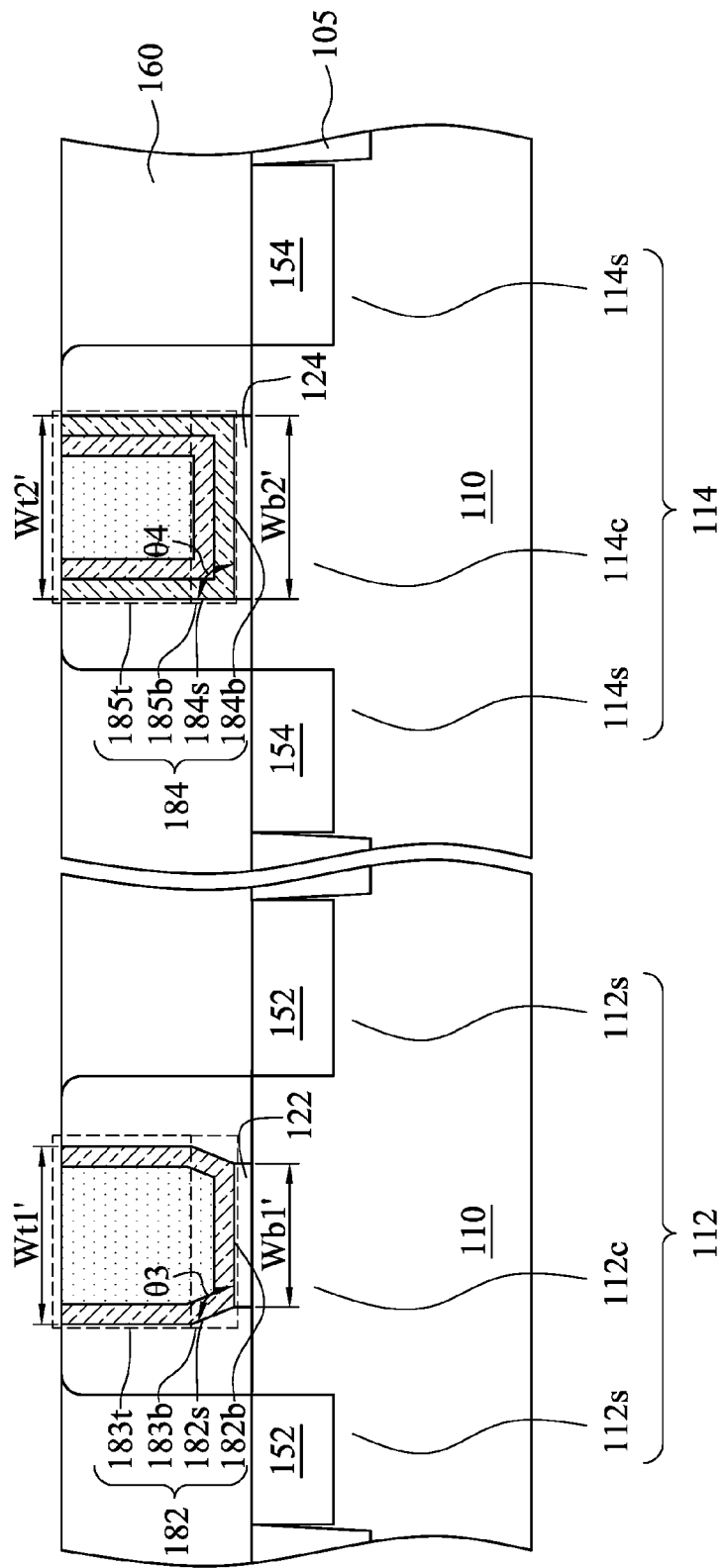
FIGS. 3A and 3B are cross-sectional views of the semiconductor device at stage of FIG. 1M in accordance with some embodiments of the present disclosure.
Figure 3B:
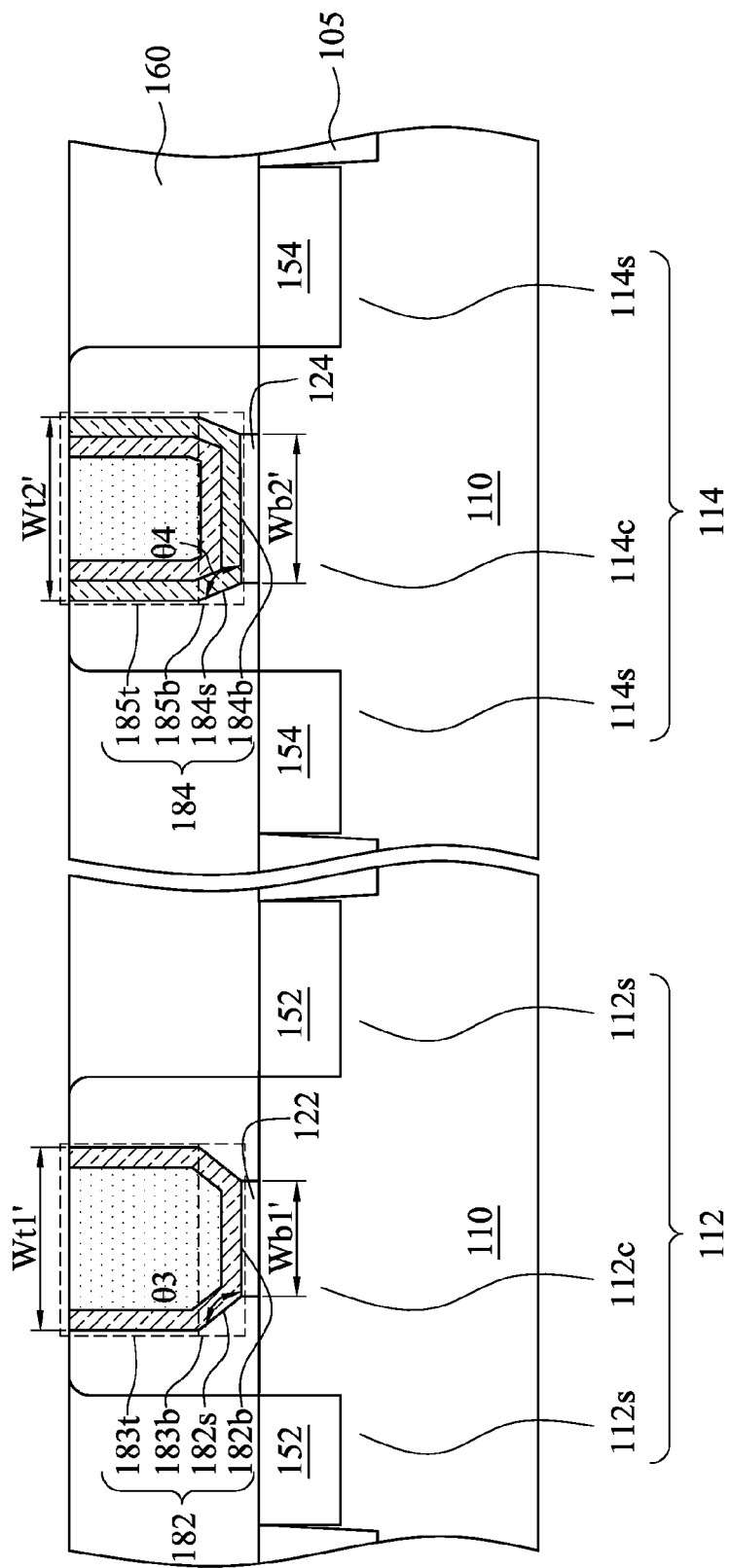

However, the profile of the metal gate structure 182 is not limited in this respect. Reference is made to FIGS. 3A and 3B. In FIGS. 3A and 3B, the interior angles $\theta3$ are obtuse angles. That is, the interior angle $\theta3$ is greater than 90 degrees. Furthermore, the width Wb1' of the bottom portion 183b is narrower than the width Wt1' of the top portion 183t. Hence, the dummy gate structures 182 in FIGS. 3A and 3B have notch profiles.

Moreover, in FIG. 1M, the metal gate structure 184 has a footing profile. In greater detail, the metal gate structure 184 has a bottom surface 184b and at least one sidewall 184s. The bottom surface 184b and the sidewall 184s intersect to form an interior angle $\theta4$. The interior angle $\theta4$ is an angle inside the metal gate structure 184. In FIG. 1M, the interior angle $\theta4$ is an acute angle. That is, the interior angle $\theta4$ is less than 90 degrees. To describe from another point of view, the metal gate structure 184 includes a top portion 185t and a bottom portion 185b disposed between the top portion 185t and the substrate 110. The top portion 185t has a width Wt2', and the bottom portion 185b has a width Wb2'. The width Wb2' of the bottom portion 185b is greater than the width Wt2' of the top portion 185t.

However, the profile of the metal gate structure 184 is not limited in this respect. FIGS. 3A and 3B are cross-sectional views of the semiconductor device at stage of FIG. 1M in accordance with some embodiments of the present disclosure. In FIG. 3A, the interior angle $\theta4$ is a substantially right angle. That is, the interior angle $\theta4$ is substantially 90 degrees. Furthermore, the width Wb2' of the bottom portion 185b is substantially the same as the width Wt2' of the top portion 185t. In FIG. 3B, the interior angle $\theta4$ is an obtuse angle. That is, the interior angle $\theta4$ is greater than 90 degrees. Furthermore, the width Wb2' of the bottom portion 185b is narrower than the width Wt2' of the top portion 185t. Hence, the metal gate structure 184 in FIG. 3B has a notch profile.

In FIGS. 1M, 3A, and 3B, the interior angle $\theta3$ is greater than the interior angle $\theta4$. Furthermore, the widths Wb1', Wb2', Wt1', and Wt2' satisfy the relationship of (Wb2'−Wt2')>(Wb1'−Wt1'). Moreover, the width Wt1' of the metal gate structure 182 is substantially the same as the width Wt2' of the metal gate structure 184.

According to the aforementioned embodiments, the profiles gate structures (such as the dummy gate structures and/or the metal gate structures) of the n-type semiconductor device and the p-type semiconductor device can be different by doping different dopants into the dummy gate layer and then performing an etching process. With this configuration, the accommodate window of the opening of the p-type semiconductor device, and more layer can be present thereof. Therefore, the electrical properties (such as Ion and Ioff) of the n-type semiconductor device and the p-type semiconductor device can be improved.

According to some embodiments, an integrated circuit includes a substrate, at least one n-type semiconductor device, and at least one p-type semiconductor device. The n-type semiconductor device is present on the substrate. The n-type semiconductor device includes a gate structure having a bottom surface and at least one sidewall. The bottom surface of the gate structure of the n-type semiconductor device and the sidewall of the gate structure of the n-type semiconductor device intersect to form an interior angle. The p-type semiconductor device is present on the substrate. The p-type semiconductor device includes a gate structure having a bottom surface and at least one sidewall. The bottom surface of the gate structure of the p-type semiconductor device and the sidewall of the gate structure of the p-type semiconductor device intersect to form an interior angle smaller than the interior angle of the gate structure of the n-type semiconductor device.

According to some embodiments, an integrated circuit includes a substrate, at least one n-type semiconductor device, and at least one p-type semiconductor device. The n-type semiconductor device is present on the substrate. The n-type semiconductor device includes a first gate structure. The first gate structure includes a top portion and a bottom portion present between the top portion and the substrate. The top portion has a first top width, and the bottom portion has a first bottom width. The p-type semiconductor device is present on the substrate. The p-type semiconductor device includes a second gate structure. The second gate structure includes a top portion and a bottom portion disposed between the top portion and the substrate. The top portion has a second top width, and the bottom portion has a second bottom width. The first gate structure and the second gate structure substantially satisfy:

(Wb1−Wt1)>(Wb2−Wt2), wherein Wb1 is the first bottom width of the bottom portion of the first gate structure, Wt1 is the first top width of the top portion of the first gate structure, Wb2 is the second bottom width of the bottom portion of the second gate structure, and Wt2 is the second top width of the top portion of the second gate structure.

According to some embodiments, a method for manufacturing an integrated circuit includes forming a gate layer on a substrate. The gate layer has a first portion and a second portion. The first portion of the gate layer is doped with a plurality of first dopants while the second portion of the gate layer is undoped with the first dopants. At least the first portion and the second portion of the gate layer are patterned to respectively form a first gate structure and a second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a substrate;
    at least one n-type semiconductor device present on the substrate, wherein:
        the n-type semiconductor device comprises a first semiconductor fin,
        the n-type semiconductor device comprises a first gate structure having:
            a first bottom surface overlying a first top surface of the first semiconductor fin;
            a first sidewall overlying the first top surface; and
            a second sidewall overlying the first top surface, and
            the first bottom surface and the first sidewall intersect to form a first interior angle;
            the first bottom surface and the second sidewall intersect to form a second interior angle; and
    at least one p-type semiconductor device present on the substrate, wherein:
        the p-type semiconductor device comprises a second semiconductor fin,
        the p-type semiconductor device comprises a second gate structure having:
            a second bottom surface overlying a second top surface of the second semiconductor fin;
            a third sidewall overlying the second top surface; and
            a fourth sidewall overlying the second top surface, and
            the second bottom surface and the third sidewall intersect to form a third interior angle smaller than the first interior angle and the second interior angle,
            the second bottom surface and the fourth sidewall intersect to form a fourth interior angle smaller than the first interior angle and the second interior angle,
            a width of the second bottom surface is greater than a width of the first bottom surface, and
            a second cross-sectional area of the second gate structure at a top of the second semiconductor fin is larger than a first cross-sectional area of the first gate structure at a top of the first semiconductor fin.

2. The integrated circuit of claim 1, wherein the first interior angle is an obtuse angle.

3. The integrated circuit of claim 1, wherein the first interior angle is a substantially right angle.

4. The integrated circuit of claim 1, wherein the second gate structure comprises:
    a p-type work function layer having a third top surface facing away from the second top surface and a fifth sidewall overlying the second top surface, wherein:
        the third top surface and the fifth sidewall intersect to form a fifth interior angle, and
        the fifth interior angle is an acute angle.

5. The integrated circuit of claim 1, wherein the third interior angle is an acute angle.

6. The integrated circuit of claim 1, wherein the second gate structure consists of a first number of layers greater than one.

7. The integrated circuit of claim 6, wherein:
    the first gate structure consists of a second number of layers greater than one, and
    the first numbers of layers is greater than the second number of layers.

8. The integrated circuit of claim 1, wherein the n-type semiconductor device further comprises:
    a gate dielectric having:
        a third top surface overlying the first top surface and interfacing with the first bottom surface, and
        a third bottom surface overlying the first top surface and interfacing with the first top surface.

9. The integrated circuit of claim 1, wherein:
    the second gate structure comprises:
        a first work function material layer forming a third interior angle equal to the second interior angle; and
        a second work function material layer forming a fourth interior angle equal to the first interior angle.

10. The integrated circuit of claim 9, wherein the first work function material layer is in contact with a first dielectric layer underlying the second gate structure.

11. The integrated circuit of claim 10, wherein the first gate structure comprises the second work function material layer forming a fifth interior angle equal to the first interior angle.

12. The integrated circuit of claim 11, wherein the second work function material layer, of the first gate structure, is in contact with a second dielectric layer underlying the first gate structure.

13. An integrated circuit comprising:
    a substrate;
    at least one n-type semiconductor device present on the substrate, wherein:
        the n-type semiconductor device comprises a first semiconductor fin,
        the n-type semiconductor device comprises a first gate structure,
        the first gate structure comprises a first top portion overlying a first top surface of the first semiconductor fin and a first bottom portion overlying the first top surface and present between the first top portion and the first top surface,
        the first top portion has a first top width, and
        the first bottom portion has a first bottom width; and
    at least one p-type semiconductor device present on the substrate, wherein:
        the p-type semiconductor device comprises a second semiconductor fin, the p-type semiconductor device comprises a second gate structure, the second gate structure comprises a second top portion overlying a second top surface of the second semiconductor fin and a second bottom portion overlying the second top surface and present between the second top portion and the second top surface, the second top portion has a second top width, the second bottom portion has a second bottom width, and the first gate structure and the second gate structure substantially satisfy:

(Wb2-Wt2)>(Wb1-Wt1), wherein Wb1 is the first bottom width, Wt1 is the first top width, Wb2 is the second bottom width, and Wt2 is the second top width resulting in a second cross-sectional area of the second gate structure at a top of the second semiconductor fin being larger than a first cross-sectional area of the first gate structure at a top of the first semiconductor fin.

14. The integrated circuit of claim 13, wherein the first top width is substantially equal to the second top width.

15. The integrated circuit of claim 13, wherein the first top width is substantially equal to the first bottom width.

16. The integrated circuit of claim 13, wherein the second bottom width is greater than the second top width.

17. The integrated circuit of claim 13, wherein the first top width is greater than the first bottom width.

18. The integrated circuit of claim 13, wherein the second top width is substantially equal to the second bottom width.

19. An integrated circuit comprising:

a substrate;

at least one n-type semiconductor device present on the substrate, wherein:

the n-type semiconductor device comprises a first semiconductor fin, the n-type semiconductor device comprises a first gate structure having:

a first sidewall that comprises a first non-tapered, vertical portion overlying a first top surface of the first semiconductor fin and extending from a second top surface of the first gate structure overlying the first top surface to a first bottom surface of the first gate structure overlying the first top surface; and a second sidewall that comprises a second non-tapered, vertical portion overlying the first top surface and extending from the second top surface to the first bottom surface; and at least one p-type semiconductor device present on the substrate, wherein:

the p-type semiconductor device comprises a second semiconductor fin, the p-type semiconductor device comprises a second gate structure having:

a third sidewall that comprises a third non-tapered, vertical portion overlying a third top surface of the second semiconductor fin and a first tapered portion overlying the third top surface; and a fourth sidewall that comprises a fourth non-tapered, vertical portion overlying the third top surface and a second tapered portion overlying the third top surface, a second cross-sectional area of the second gate structure at a top of the second semiconductor fin is larger than a first cross-sectional area of the first gate structure at a top of the first semiconductor fin, the third non-tapered, vertical portion extends from a fourth top surface of the second gate structure overlying the third top surface to the first tapered portion, the fourth non-tapered, vertical portion extends from the fourth top surface to the second tapered portion, the first tapered portion extends from the third non-tapered, vertical portion to a second bottom surface of the second gate structure overlying the third top surface, and the second tapered portion extends from the fourth non-tapered, vertical portion to the second bottom surface.

20. The integrated circuit of claim 19, wherein:

the first gate structure consists of a first number of layers greater than one, the second gate structure consists of a second number of layers greater than one, and the second numbers of layers is greater than the first number of layers.

* * * * *